United States Patent
David et al.

(10) Patent No.: US 7,521,172 B2
(45) Date of Patent: Apr. 21, 2009

(54) TOPCOAT MATERIAL AND USE THEREOF IN IMMERSION LITHOGRAPHY PROCESSES

(75) Inventors: Robert Allen David, San Jose, CA (US); Phillip Joe Brock, Sunnyvale, CA (US); Sean David Burns, Hopewell Junction, NY (US); Dario Leonardo Goldfarb, Mohegan Lake, NY (US); David Medeiros, Dobbs Ferry, NY (US); Dirk Pfeiffer, Dobbs Ferry, NY (US); Matt Pinnow, Woodbury, MN (US); Ratnam Sooriyakumaran, San Jose, CA (US); Linda Karin Sundberg, Los Gatos, CA (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 11/380,782

(22) Filed: Apr. 28, 2006

(65) Prior Publication Data

US 2007/0254237 A1 Nov. 1, 2007

(51) Int. Cl.
G03F 7/20 (2006.01)
G03F 7/26 (2006.01)
C08F 220/22 (2006.01)

(52) U.S. Cl. ............... 430/270.1; 430/273.1; 526/242; 526/245; 526/308; 526/309; 526/318

(58) Field of Classification Search ............ 430/270.1, 430/273.1; 526/242, 318, 281, 308, 309, 526/245

See application file for complete search history.

(56) References Cited

U.S. PATENT DOCUMENTS

| 3,981,987 | A | * | 9/1976 | Linke et al. | 424/47 |
| 4,255,299 | A | * | 3/1981 | Daimon et al. | 524/32 |
| 4,472,494 | A | * | 9/1984 | Hallman et al. | 430/160 |
| 6,191,476 | B1 | * | 2/2001 | Takahashi et al. | 257/706 |
| 6,835,269 | B1 | * | 12/2004 | Miharu et al. | 156/244.11 |
| 2001/0006736 | A1 | * | 7/2001 | Kuroda et al. | 428/517 |
| 2006/0008748 | A1 | * | 1/2006 | Inabe et al. | 430/326 |
| 2006/0188804 | A1 | * | 8/2006 | Allen et al. | 430/270.1 |

* cited by examiner

*Primary Examiner*—Cynthia H. Kelly
*Assistant Examiner*—Anca Eoff
(74) *Attorney, Agent, or Firm*—Theresa O'Rourke Nugent; Nugent & Smtih, LLP.

(57) ABSTRACT

Disclosed is a topcoat composition comprising a polymer having a dissolution rate of at least 1500 Å/second in an aqueous alkaline developer, and at least one solvent. The topcoat composition can be used to coat a photoresist layer on a material layer on a substrate, for example, a semiconductor chip. Also disclosed is a method of forming a pattern in the material layer of the coated substrate.

17 Claims, 5 Drawing Sheets

TOPCOAT MATERIAL AND USE THEREOF IN IMMERSION LITHOGRAPHY PROCESSES

BACKGROUND OF THE INVENTION

1. Field of the Invention

The present invention relates generally to a topcoat composition, a method of forming a patterned material layer on a substrate and a coated substrate composition.

2. Description of Related Art

The continuous drive to print smaller structures for advanced electronic device manufacturing requires the use of higher resolution optical lithography tools. Immersion lithography has the potential to extend current 193 nm argon fluoride-based technology to 45 nm critical dimensions (half-pitch DRAM) and beyond by effectively improving the depth-of-focus processing window for a given optical numerical aperture (NA). In addition, it enables lens designs with NA greater than 1.0, thus resulting in an increased resolution of optical scanners. The process requires filling the gap between the last lens element of the exposure tool and the resist-coated substrate with ultrapure water. See A. Hand, "Tricks With Water and Light: 193 nm Extension", Semiconductor International, Vol. 27, Issue 2, February 2004.

One of the technical challenges facing liquid immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist performance and might result in disastrous lens damage or contamination in a 40 million dollar lithography tool. Therefore, there is a need for a method to prevent interaction between photoresist layers and immersion fluid in an immersion lithography system.

Topcoat materials can be applied on top of the photoresist layer for the purpose of eliminating diffusion of materials from the photoresist layer underneath, and to prevent the permeation of the exposure medium into the photoresist film.

Traditionally, topcoat materials have been used in photolithography as anti-reflective films on top of a photoresist. The top anti-reflective coat (TARC) materials can prevent the multiple interference of light that takes place within the photoresist layer during exposure. As a result, the critical dimension (CD) variation of the geometrical features of a photoresist pattern caused by the variation in the thickness of the photoresist film can be minimized. To fully take advantage of the anti-reflective effect of the topcoat, the refractive index of the topcoat material ($n_t$) should be at about the square root of the product of the refractive index of the exposure medium ($n_m$) and the refractive index of the underlying photoresist ($n_r$). If the exposure medium is air, as in the case for "dry" lithography, the optimal refractive index of the topcoat material ($n_t$) should be at about the square root of the refractive index of the underlying photoresist ($n_r$) since the refractive index of air is roughly 1.

For ease of processing, classic TARC materials are designed to be soluble in both water and aqueous base developers so that they can be applied directly from water solution and subsequently removed by the aqueous base developer during the development stage.

Numerous topcoat materials have been developed to meet these two requirements of optimal refractive index and solubility. For example, U.S. Pat. Nos. 5,744,537 and 6,057,080 disclose aqueous-soluble TARC materials comprising a polymeric binder and a fluorocarbon compound, which have nearly ideal refractive indices on the order of 1.3-1.4. U.S. Pat. No. 5,879,853 also discloses a TARC material that is removable by a wet process. U.S. Pat. No. 5,595,861 similarly discloses a TARC comprising partially fluorinated compounds, which can also be water soluble. U.S. Pat. No. 6,274,295 discloses a TARC material comprising a light-absorbing compound having a wavelength of maximum absorption higher than an exposure wavelength used to expose the photoresist. This TARC can also be water-soluble. Finally, U.S. Pat. No. 5,240,812 discloses a protective material for use as an overcoat film for acid catalyzed resist compositions to prevent contamination from vapors of organic and inorganic bases. While not specifically disclosed as being a TARC, the overcoat can also be water-soluble.

Since water has been proposed as the exposure medium for 193 nm immersion lithography, classic water-soluble TARC materials such as those described above cannot be used as topcoats for such technology. Other commercial materials currently available either require solvents that are incompatible with semiconductor fab lines or impact the lithographic performance of the photoresist. New topcoat materials are needed to ensure the deployment of 193 nm immersion lithography necessary for manufacture of semiconductor devices at 45 nm and below design ground rules. See M. Slezak, "Exploring the needs and tradeoffs for immersion resist topcoating", Solid State Technology, Vol. 47, Issue 7, July 2004.

This is a new area of exploration and there is a need to develop a variety of topcoats that is compatible with different resists, or ultimately functions as a universal topcoat.

A serious technical challenge facing immersion lithography is the presence of bubbles and/or other small particles at the photoresist surface. The presence of small bubbles and/or particles at the photoresist surface causes printable image defects. One way to prevent this effect is through the application of a topcoat of sufficient thickness such that the bubbles and/or small particles are out of the focal plane of the lens and thus they are no longer lithographically printable. This thick coating can be described as an in situ pellicle. For purposes of this application, such a coating will be referred to simply as a pellicle. In addition, the thick topcoat material may reduce extraction of resist components into the immersion medium as compared to prior art thin topcoat materials. Since prior art immersion topcoat materials have a lower dissolution rate in developer than the underlying exposed photoresist, such topcoat films are necessarily very thin, so they can be quickly stripped with developer during the photoresist development step. If the topcoat film is not removed quickly, the photoresist performance will be negatively impacted. Therefore, a topcoat film that is thick enough to move the surface bubbles and/or particles out of the lithography process focal plane would not be acceptable for use in immersion lithography unless the thick topcoat film could still be rapidly stripped under normal development conditions. Thus, there remains a need for a topcoat material that is highly soluble in developer, resistant to immersion fluid, compatible with photoresist, and has desired optical properties so that it can also be used as a TARC.

SUMMARY OF THE INVENTION

These and other objects were met with the present invention, which relates in a first embodiment to a topcoat composition comprising a polymer having a dissolution rate of at least 1500 Å/second in an aqueous alkaline developer, and at least one solvent.

The present invention relates in a second embodiment to a method of forming a patterned material layer on a substrate, the method comprising:
- a) providing a substrate having a material layer on a surface thereof;
- b) depositing a photoresist composition on the substrate to form a photoresist layer on the material;
- c) applying the inventive topcoat composition on the photoresist layer, thereby forming a coated substrate;
- d) pattern-wise exposing the coated substrate to an imaging radiation; and
- e) contacting the coated substrate with an aqueous alkaline developer, wherein the topcoat composition and a portion of the photoresist layer are simultaneously removed from the coated substrate, thereby forming a patterned photoresist layer on the material layer.

The present invention relates in a third embodiment to a coated substrate composition comprising:
- a) a substrate having a material layer on a surface thereof;
- b) a photoresist layer formed on the material layer; and
- c) the inventive topcoat composition applied to the photoresist layer.

BRIEF DESCRIPTION OF THE DRAWINGS

The invention will now be described in greater detail with reference to the drawings, wherein:

FIG. 2B. SEM image (right) of a photoresist patterned with the use of topcoat PiBMAC4 (60 nm thick), using 0.75 NA 193 nm immersion lithography (80 nm line-and-space features). Left image is a comparison with a prior art immersion topcoat imaged under the same conditions.

DETAILED DESCRIPTION OF THE INVENTION

Figure 1:
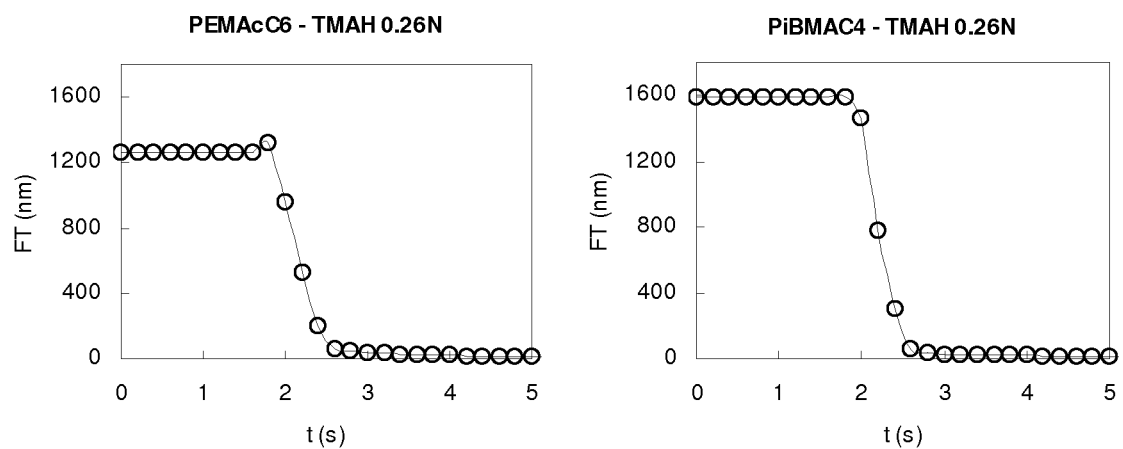
FIG. 1 is a graph plotting thickness (nm) v. time (sec) illustrating the dissolution rates for exemplary embodiments of the inventive topcoat materials. Dissolution rates of PEMAcC6 (Mw=200k Dalton) and PiBMAC4 (Mw=6k Dalton) in TMAH 0.26N.
Figure 2A:
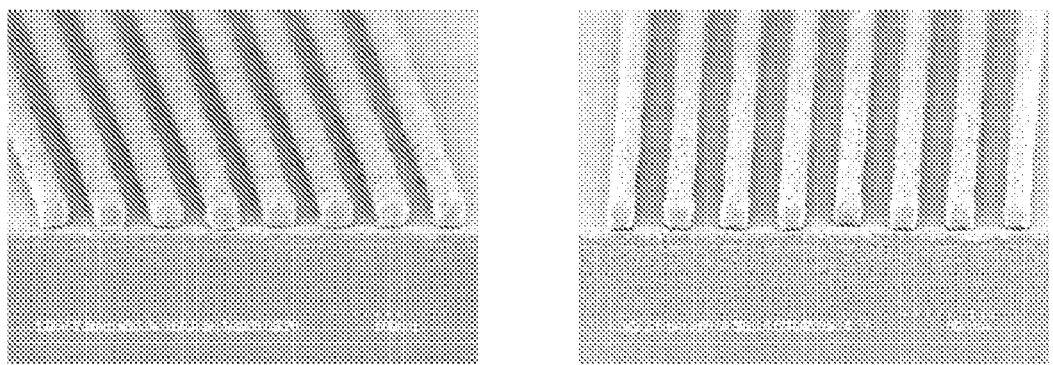
FIG. 2A-2B shows SEMs of the developed commercial photoresists imaged in dry and wet conditions at 193 nm and developed, utilizing the inventive topcoat applied on top of each of the photoresist layers before imaging. SEM images of a photoresist patterned with (left) and without (right) the use of topcoat PiBMAC4 (100 nm thick), using dry 0.63 NA 193 nm lithography (130 nm line-and-space features).
Figure 2B:
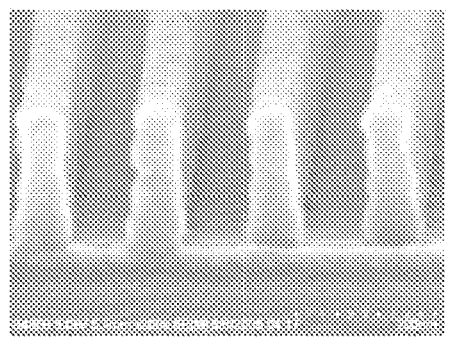
Figure 2B:
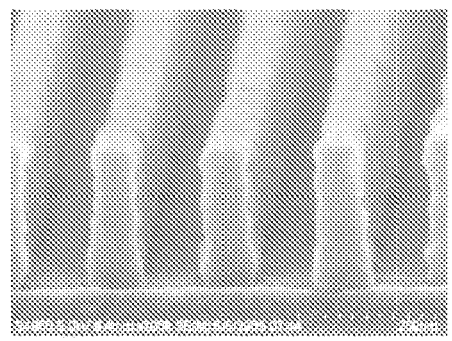

It has been discovered that the inventive topcoat composition incorporates a polymer having an advantageous dissolution rate and that this composition additionally incorporating an aqueous alkaline developer, and at least one solvent, overcomes many disadvantages of the prior art.

In a preferred embodiment, the topcoat composition comprises a polymer which preferably contains a maleic acid mono ester monomer unit, comprising the following structure:

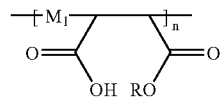

wherein
n is an integer;
$M_1$ is a co-monomer; and
R is a hydrogenated, partially fluorinated or fluorinated alkyl or cycloalkyl chain comprising 1 to 12 carbon atoms.

In an especially preferred embodiment, this topcoat composition comprises a co-monomer $M_1$, which is selected from the group consisting of co-monomers comprising at least one of the formulas:

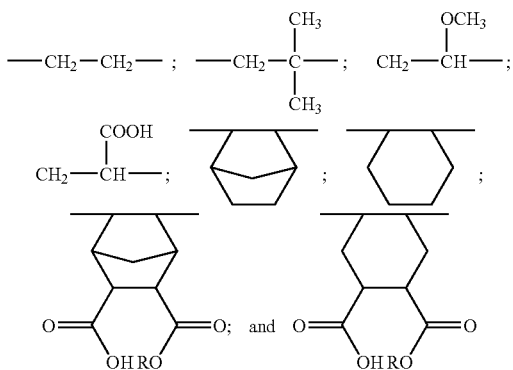

wherein R has the meaning given above.

In another preferred embodiment, R in the foregoing formulae is a hydrogenated, partially fluorinated or fluorinated alkyl or cycloalkyl chain having 1 to 12 carbon atoms; and the polymer comprises up to 50 mole % of one or more methacrylate or acrylate co-monomers.

In another preferred embodiment, the topcoat composition comprises one or more methacrylate co-monomers selected from the group consisting of methyl methacrylate; ethyl methacrylate; alicyclic methacrylate; acyclic alkyl substituted methacrylates; methacrylic acid; hydroxyethyl methacrylate; hydroxypropyl methacrylate; hydroxy substituted alicyclic methacrylate; and acyclic hydroxyalkyl substituted methacrylates, wherein the alkyl and the alicyclic groups independently have 1 to 12 carbon atoms.

In another preferred embodiment, the topcoat composition comprises one or more acrylate co-monomers selected from the group consisting of methyl acrylate; ethyl acrylate; alicyclic acrylate; acyclic alkyl substituted acrylates; acrylic acid; hydroxyethyl acrylate; hydroxypropyl acrylate; hydroxy substituted alicyclic acrylate; and acyclic hydroxyalkyl substituted acrylates, wherein the alkyl and the alicyclic groups independently have 1 to 12 carbon atoms.

In a preferred embodiment, the topcoat composition comprises a thickness of about 1 to about 10 microns wherein bubbles or small particles present therein are not lithographically printable.

The topcoat composition preferably comprises at least one solvent that is immiscible with a photoresist material. In an especially preferred embodiment, the solvent is a hydrocarbon alcohol. In a particularly preferred embodiment, the hydrocarbon selected from the group consisting of 1-butanol;

methanol; ethanol; 1-propanol; ethylene glycol; 1,2-butanediol; 1,3-butanediol; 1,4-butanediol; 1,2-propanediol; and 1,3-propanediol and other hydrocarbon alcohols having 4 to 8 carbons.

In a preferred embodiment, the topcoat composition comprises a polymer which is insoluble in water.

In another preferred embodiment, the topcoat composition comprises a polymer, which is substantially optically transparent to an appropriate exposure radiation for the underlying photoresist material. In an especially preferred embodiment, the polymer has a refractive index in the range of about 1.2 to about 1.8, particularly about 1.5 to about 1.7.

In another preferred embodiment, the topcoat composition comprises a polymer having a tunable molecular weight ranging from about 3K Daltons to about 500K Daltons.

In yet another preferred embodiment, the topcoat composition comprises a polymer having a Tg above 50° C., especially having a Tg equal or above the photoresist processing temperature, and very particularly having a Tg of about 130° C. or above.

In a preferred embodiment, the material layer is selected from the group consisting of ceramic; dielectric; metal and semiconductor layers.

Prior to exposing the coated substrate to imaging radiation, an imaging medium, especially water, is applied to the coated substrate. Thereafter, the coated substrate is exposed to imaging medium, especially 193 nm, 157 nm or 248 nm, to form a pattern in the photoresist.

The coated substrate is preferably a semiconductor substrate, especially a bulk single crystal silicon wafer, or silicon or insulation wafer.

The pattern in the photoresist layer is transferred to the material layer by removing portions of the material layer not covered by the patterned photoresist layer. Preferably, this is done by etching the material layer in areas not covered by the patterned photoresist layer. In an especially preferred embodiment, portions of the material layer are removed by using reactive ion etching.

EXAMPLES

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric.

Example 1

Synthesis of Poly(ethylene-alt-maleic acid cyclohexyl monoester)

A 125 mL single-neck flask was equipped with a magnetic stirrer, temperature controlled heating mantle, thermocouple thermometer, and a standard condenser opened to the atmosphere. The flask was charged with 2.5 grams of poly(ethylene-alt-maleic anhydride) (Mw=200K Dalton) and 10 grams of cyclohexanol (0.1 mol). The reaction mixture was heated to 125° C. internal temperature and refluxed for 2 hours. The mixture was then cooled and 1-Butanol (30 g) was added to the resulting product. The diluted mixture was filtered using a 0.2 um pore size hydrophobic filter, to yield a casting solution of poly(isobutylene-alt-maleic acid cyclohexyl monoester) in 1-Butanol that formed 40-60 nm thick coatings at 2-5 K RPM spin speeds.

Example 2

Synthesis of Poly(isobutylene-alt-maleic acid butyl monoester)

A 125 mL single-neck flask was equipped with a magnetic stirrer, temperature controlled heating mantle, thermocouple thermometer, and a standard condenser opened to the atmosphere. The flask was charged with 2.5 grams of poly(isobutylene-alt-maleic anhydride) (Mw=6K Dalton) and 50 grams of 1-Butanol (0.66 mol). The reaction mixture was heated to 110° C. internal temperature and refluxed for 36 hours. The mixture was then cooled and filtered using a 0.2 um pore size hydrophobic filter, to yield a casting solution of poly(isobutylene-alt-maleic acid butyl monester) in 1-Butanol that formed 40-60 nm thick coatings at 2-5 K RPM spin speeds.

Example 3

Synthesis of Poly(norbornene-alt-maleic acid butyl monoester)

Norbornene (40.7 g; 432 mmol) was vacuum-transferred into a dry 500 mL Schlenk flask equipped with two PTFE-stoppered inlet valves and an efficient stir bar. Freshly sublimed maleic anhydride (42.4 g; 432 mmol), AIBN (0.706 g; 1.0 mol %), and THF (60 mL) were added under positive argon pressure. The mixture was degassed by three freeze-pump-thaw cycles, sealed, and immersed in an oil bath at 65° C. for 24 h. Upon cooling, the mixture was precipitated into five volumes of diethyl ether and filtered to collect the polymer. The solid was redissolved in 100 mL of acetone and precipitated into five volumes of diethyl ether. This process was repeated three times in total. The polymer was collected in the final filtration and dried at 50° C. in vacuo to yield 60.89 g (73%) of copolymer. Subsequently, 2.5 g of the dry powder was transferred into a 125 mL single-neck flask equipped with a magnetic stirrer, temperature controlled heating mantle, thermocouple thermometer, and a standard condenser opened to the atmosphere. The flask was charged with 50 grams of 1-Butanol (0.66 mol). The reaction mixture was heated to 110° C. internal temperature and refluxed for 36 hours. The mixture was then cooled and filtered using a 0.2 um pore size hydrophobic filter, to yield a casting solution of poly(norbornene-alt-maleic acid butyl monoester) in 1-Butanol that formed 40-60 nm thick coatings at 2-5 K RPM spin speeds.

Example 4

Synthesis of Poly(norbornane-alt-maleic acid methyl monoester)

Norbornene-alt-maleic anhydride copolymer (10 g) was heated in a 100 mL flask with 50 grams of anhydrous octanol, at reflux, under nitrogen for 24 hours. The internal temperature remained at 65° C. for the entire reflux period. The reaction mixture was cooled, the solvent evaporated, and the resulting foam pumped at high vacuum (100 milliTorr) to a constant weight to yield 10.3 grams of product. This product could be dissolved in alcohol solvents for spin-coating application.

Example 5

Synthesis of Poly(norbornane-alt-maleic acid octyl monoester)

Norbornene-alt-maleic anhydride copolymer (3 g) was heated in a 100 mL flask with 50 grams of anhydrous methanol, at reflux, under nitrogen, for 24 hours. The cooled reaction mixture was precipitated in 2000 milliliters of hexane and the resulting solid recovered by filtration. After drying at 100 milliTorr, 3.0 grams of half-ester polymer was obtained. This product could be dissolved in alcohol solvents for spin-coating application.

Example 6

Synthesis of Poly(norbornene-maleic anhydride, acrylic acid terpolymer)

Norbornene (18.83 g; 200 mmol), maleic anhydride (19.62 g; 200 mmol), acrylic acid (7.20 g; 100 mmol), 40 grams of ethyl acetate, and 40 grams of anhydrous THF were transferred into a dry 250 mL round bottom flask equipped with a thermocouple thermometer, condenser with nitrogen bubbler, temperature controlled heating mantle, and magnetic stirrer. The mixture was degassed by three vacuum/nitrogen cycles then heated to 70° C., when V-601 (dimethyl-2,2'-azoisobutyrate) (2.3 grams; 100 mmol) was added under a nitrogen blanket. The reaction mixture was degassed with nitrogen and heated to reflux under a nitrogen atmosphere. The initial reflux temperature was 78° C. dropping to 71° C. after 16 hours at reflux. Upon cooling, the mixture was precipitated into 3500 milliliters of hexane and filtered to collect the polymer. The solid washed with 3×350 milliliters of hexane, and 2×350 milliliters of 2-propanol. The solid was dried under vacuum at 60° C., yielding 44.2 grams of product.

Example 7

Synthesis of Poly(norbornene-maleic acid methyl half ester, acrylic acid co-polymer)

A suspension of 10 grams of the polymer prepared in example 6 was heated at reflux, under nitrogen, with 50 grams of anhydrous methanol. After 36 hours at reflux the solvent was evaporated to yield 10.1 grams of polymer after drying at 100 milliTorr and 70° C. to constant weight. This product could be dissolved in alcohol solvents for spin-coating application.

Example 8

Synthesis of Poly(Tetracyclododecene-alt-maleic anhydride copolymer)

Tetracyclododecene (12.0 g; 75 mmol), maleic anhydride (7.36 g; 75 mmol), and 25 grams of ethyl acetate were charged into a 100 mL round bottom flask equipped with a thermocouple thermometer, condenser with nitrogen bubbler, temperature controlled heating mantle, and magnetic stirrer. The mixture was degassed by three vacuum/nitrogen cycles then heated to 70° C., when lauryl peroxide (1.195 g; 3 mmol) was added under a nitrogen blanket. The reaction mixture was degassed with nitrogen and heated to reflux under a nitrogen atmosphere. The initial reflux temperature was 79° C. dropping to 76° C. after 16 hours at reflux. Upon cooling, the mixture was precipitated into 3000 milliliters of 2-propanal and filtered to collect the polymer. The solid washed with 2×350 milliliters of 2-propanol and dried under vacuum at 60° C., yielding 9.78 grams of product.

Example 9

Synthesis of Poly (Tetracyclododecene-alt-maleic acid butyl half ester)

A suspension of 3 grams of the polymer prepared in example 8 was heated at reflux, under nitrogen, with 18 grams of anhydrous 1-butanol. After 36 hours at reflux the reaction solution was cooled to room temperature. This polymer solution (after filtration) could be used directly for spin-coating application.

Example 10

Synthesis of Poly (norbornane-alt-maleic acid 4,4,5,5,5-pentafluoro-1-pentanol monoester)

Norbornene-alt-maleic anhydride copolymer (1.0 g) was heated in a 100 mL flask with 9 grams of 4,4,5,5,5-pentafluoro-1-pentanol and 50 mg of 4-dimethylaminopyridine, at reflux, under nitrogen for 21 hours. The reaction mixture was cooled, stirred with 0.5 g of Amberlyst-15 for 2.5 hours, and the solution was filtered through glass wool. This solution was diluted with 5.9 g of n-butanol and filtered through 0.2 micron PTFE filter.

Figure 3A:
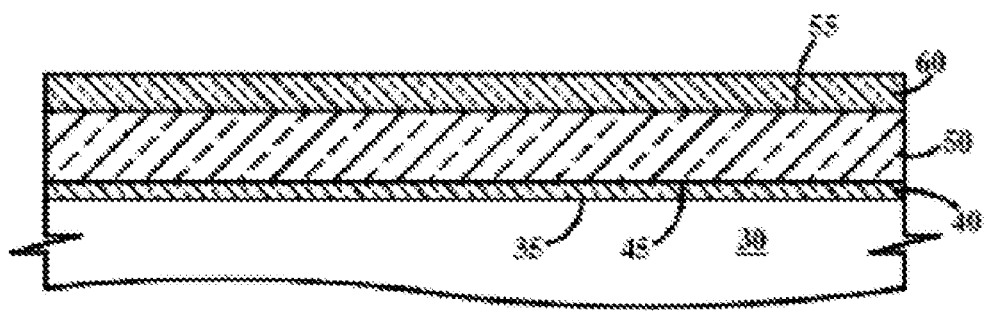
FIG. 3A through 3C are partial cross-sectional views illustrating a semiconductor manufacturing process according to the present invention.
Figure 3B:
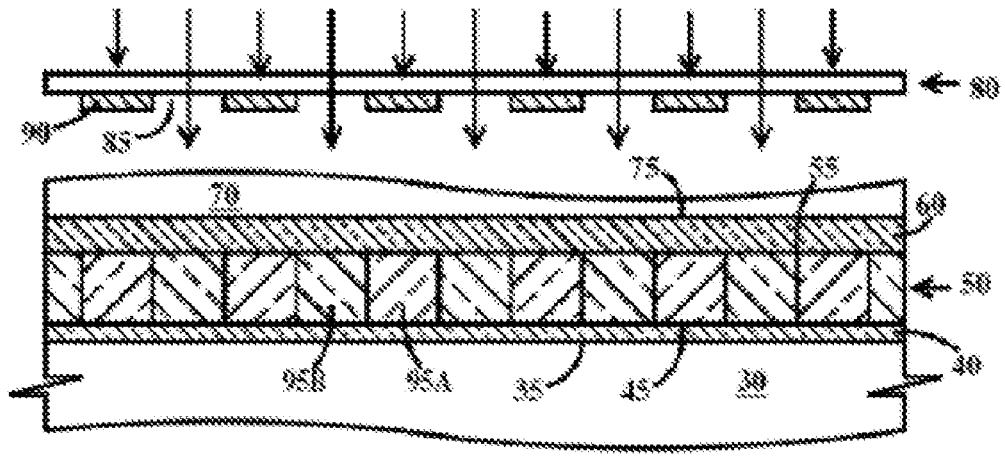
Figure 3C:
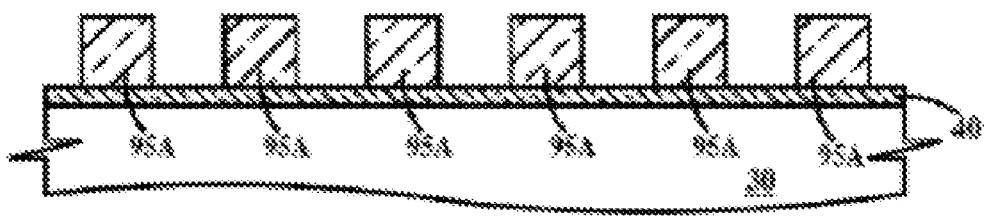

FIG. 3A through 3C are partial cross-sectional views illustrating a semiconductor manufacturing process according to the present invention. In FIG. 3A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional ARC 40. In one example, ARC 40 is spin applied and a post ARC apply bake (heated above room temperature to remove most of the ARC solvent) performed. Formed on a top surface 45 of ARC 40 is a photoresist layer 50. In one example, photoresist layer 50 is spin applied and a post photoresist apply bake, also known as a pre-exposures bake or a pre-bake (heated above room temperature to remove most of the photoresist solvent) performed. Next a topcoat 60 is formed on a top surface 55 of photoresist layer 50. In one example, topcoat 60 is spin applied and a post topcoat apply bake (heated above room temperature to remove most of the topcoat solvent) performed. Topcoat 60 comprises a maleic acid mono ester resin as described supra.

In FIG. 3B, a layer of immersion fluid 70 is formed over a top surface 75 of topcoat 60 in an immersion photolithography tool (see description infra). An example of an immersion fluid is water, with or without additives. Light of a wavelength that photoresist layer 50 is sensitive to is passed through a photomask 80. Photo mask 80 has clear regions 85 that transmit the light and opaque regions 90 that block the light. Exposure of photoresist layer 50 to light through mask 80 forms unexposed regions 95A of photoresist layer 50 and exposed regions 95B of photoresist layer 50. Exposed regions 95B are also known as latent image regions. An optional post exposure bake (heated above room temperature to drive the photoresist chemistry) may be performed.

Although a positive photoresist is shown in FIG. 3B, the present invention works equally well with negative photoresist systems or dual tone photoresist systems. In negative photoresist systems, the photoresist will develop away where it is not exposed to light, so a photomask of polarity opposite to that illustrated in FIG. 3B is required. Dual tone resists can act either negatively or positively depending upon the developer system used.

In FIG. 3C, substrate 30 is removed from the immersion photolithography tool and photoresist layer 50 developed to remove exposed regions 95B (see FIG. 3B) and leave behind unexposed regions 95A. In one example the developer comprises an aqueous solution of a base such as TMAH. Topcoat 60 (see FIG. 3B) is also removed by the developer. Optionally, topcoat layer 60 may be removed separately prior to development of the exposed photoresist layer 50. An optional post development bake, (heated above room temperature to harden the photoresist images) may be performed.

While the exposure of the photoresist layer was described in the context of an immersion photolithography system, the topcoat compositions of the present invention also have utility in conventional (non-immersion) photolithography system as described supra, as a protective coating against environmental contamination from particulates, water vapor, and chemical vapors that could degrade the imaging process or cause imperfections in the photoresist images and ultimately yield reliability defects in the fabricated product.

Figure 4:
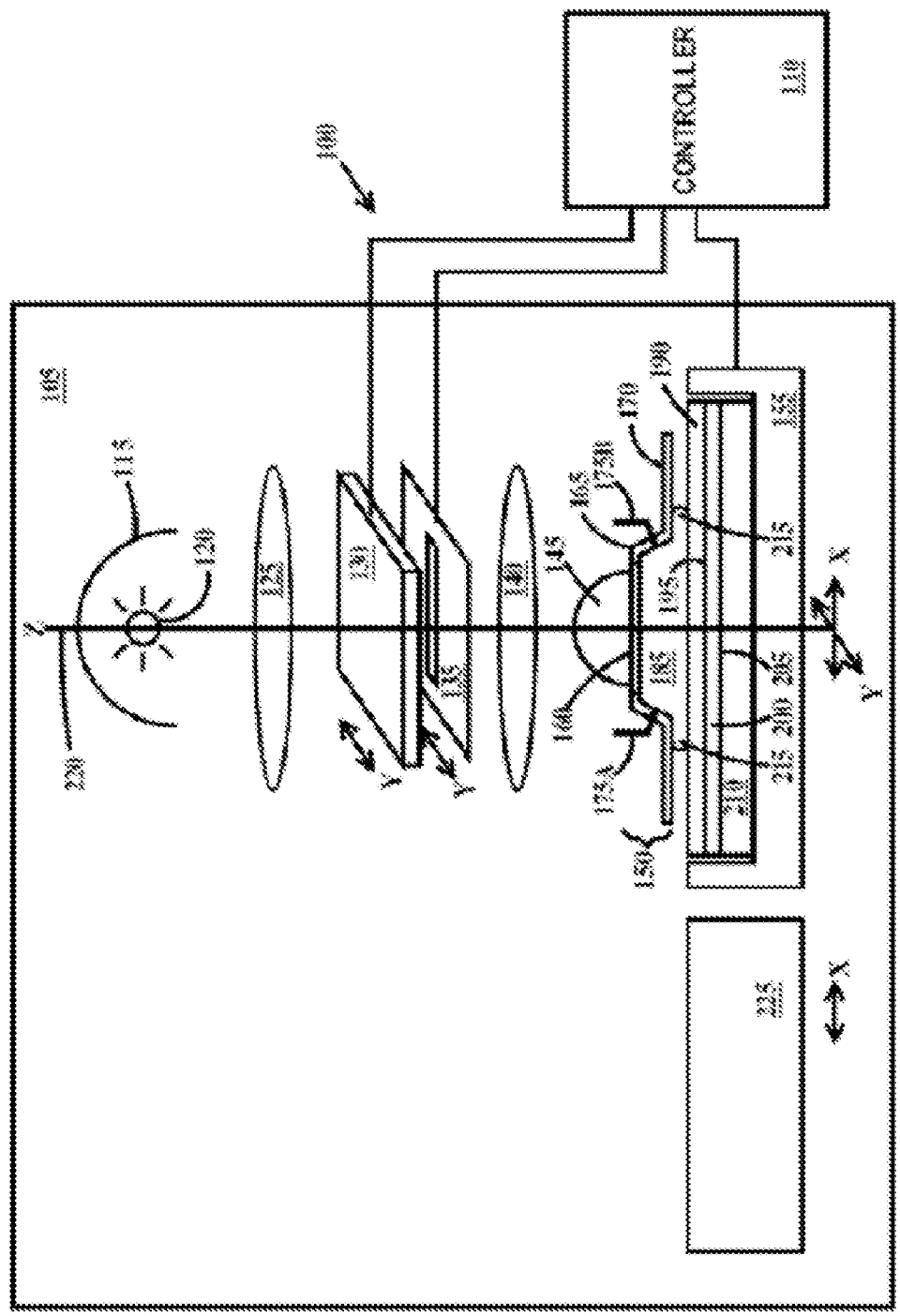
FIG. 4 is a diagram of an exemplary immersion photolithographic system that may be used to process a semiconductor wafer having a maleic acid monoester based-topcoat according to the present invention.

FIG. 4 is a diagram of an exemplary immersion photolithographic system that may be used to process a semiconductor wafer having a topcoat layer according to the present invention. In FIG. 4, an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 185 fills central chamber portion 165 and contacts a photoresist layer on a top surface of a wafer 190, and the photoresist layer includes a topcoat formed of a maleic acid mono ester resins according to the present invention. Alternatively, wafer 190 may have an ARC formed on the top surface and photoresist layer is then be formed on a top surface of the ARC. In one example, immersion fluid 185 includes water. Plate portion 170 is positioned close enough to the photoresist layer to form a meniscus under plate portion 170. Window 160 must be transparent to the wavelength of light selected to expose the photoresist layer.

Focusing mirror 115, light source 120, first focusing lens 125, a mask 130, exposure slit 135, second focusing lens 140, final focusing lens 145, immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in the photoresist layer. As an XY-stage moves, new portions of photoresist layer are brought into contact with immersion fluid 185 and previously immersed portions of the photoresist layer are removed from contact with the immersion fluid. Mask 130 and slit 135 may be moved in the Y direction under the control of controller 110 to scan the image (not shown) on mask 130 onto the photoresist layer. In one example, the image on mask 130 is a 1× to a 10× magnification version of the image to be printed and includes one or multiple integrated circuit chip images.

When exposure is complete, wafer 190 is removed from controlled environment chamber 105 without spilling immersion fluid 185. To this end, controlled environment chamber 105 also includes a cover plate 195 that may be moved to first abut with wafer chuck 155 and then moved with the wafer chuck as the wafer chuck is moved out of position from under immersion head 150, the cover plate replacing the wafer chuck under immersion head 150.

It should be understood that the preceding is merely a detailed description of a number of preferred embodiments of the present invention and that numerous changes to the disclosed embodiments can be made in accordance with the disclosure herein without departing from the spirit or scope of the invention. The preceding description, therefore, is not meant to limit the scope of the invention in any respect. Rather, the scope of the invention is to be determined only by the issued claims and their equivalents.

What is claimed is:

1. A topcoat composition comprising:
    a) a polymer, having a dissolution rate of at feast 1500 Å/second in an aqueous aikaline developer and containing a maleic acid mono ester monomer unit and up to 50 mole % of one or more methacrylate or acrylate co-monomers, said maleic acid monoester monomer unit having the following structure:

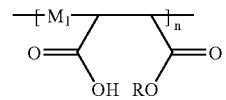

wherein
    n is an integer;
    $M_1$ is a co-monomer; and
    R is a hydrogenated partially fluorinated or fluorinated aikyl or cycloalkyl chain comprising 1 to 12 carbon atoms; and
    b) at least one solvent.

2. The topcoat composition according to claim 1, wherein said one or more methacrylate co-monomers are selected from the group consisting of methyl methacrylate; ethyl methacrylate; alicyclic methacrylate; acyctic alkyi substituted methacrylates; methacrylic acid; hyd roxyethyl methacrylate; hydroxypropyf methacryrate; hydroxy substituted alicyclic methacrylate; and acyciic hydroxyalkyl substituted methacrylates, wherein the aikyl and the alicyclic groups independently have 1 to 12 carbon atoms.

3. The topcoat composition according to claim 1, wherein said one or more acrylate co-monomers are selected from the group consisting of methyl acrylate; ethyl acrylate; alicyclic acrylate; acyclic alkyl substituted acrylates; acrylic acid; hydroxyethyl acrylate: hydroxypropyl acrylate; hydroxy substituted alicyclic acrylate; and acyclic hydroxyalkyl substituted acrylates, wherein the aikyl and the alicyclic groups independently have 1 to 12 carbon atoms.

4. The topcoat composition according to claim 1, wherein said at least one solvent is immiscible with a photoresist material.

5. The topcoat composition according to claim 1, wherein said at least one solvent is a hydrocarbon alcohol.

6. The topcoat composition according to claim 5, wherein said at least one solvent is selected from the group consisting of 1-butanol; methanol; ethanol; 1- propanol; ethylene glycol; 1,2-butanediol; 1,3-butanediol; 1,4-butanediol; 1,2-propanediol; and 1,3-propanediol and other hydrocarbon alcohols having 4 to 8 carbons.

7. A method of forming a patterned material layer on a substrate, the method comprising:
   a) providing a substrate having a material layer on a surface thereof;
   b) depositing a photoresist composition on the substrate to form a photoresist layer on the material layer;
   c) applying a topcoat composition on the photoresist layer, thereby forming a coated substrate, wherein the topcoat composition includes
      (i) at least one solvent and
      (ii) a polymer, the polymer having a dissolution rate of at least 1500 Å/second in an aqueous alkaline developer and containing a maleic acid mono ester monomer unit, and having the following structure:

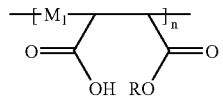

wherein
   n is an integer;
   $M_1$ is a co-monomer; and
   R is a hydrogenated, partially fluorinated or fluorinated alkyl or cycloalkyl chain comprising 1 to 12 carbon atoms;
   d) pattern-wise exposing the coated substrate to an imaging radiation; and
   e) contacting the coated substrate with an aqueous alkaline developer, wherein the topcoat composition and a portion of the photoresist layer are simultaneously removed from the coated substrate, thereby forming a patterned photoresist layer on the material layer.

8. The method according to claim 7, wherein the material layer is selected from the group consisting of ceramic; dielectric; metal and semiconductor layers.

9. The method according to claim 7, wherein the imaging radiation is 193 nm radiation.

10. The method according to claim 7, further comprising, prior to pattern-wise exposing the coated substrate to imaging radiation, the step of applying an imaging medium to the coated substrate.

11. The method according to claim 10, wherein the imaging medium is water.

12. The method according to claim 7, wherein the alkaline developer is tetramethyl ammonium hydroxide.

13. A coated substrate composition comprising:
   a) a substrate having a material layer on a surface thereof;
   b) a photoresist layer formed on the material layer; and
   c) a topcoat composition applied to the photoresist layer, wherein the topcoat composition includes
      (i) at least one solvent, and
      (ii) a polymer, the polymer having a dissolution rate of at least 1500 Å/second in an aqueous alkaline developer and containing a maleic acid mono ester monomer unit, and having the following structure:

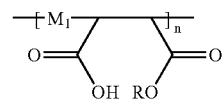

wherein
   n is an integer;
   $M_1$ is a co-monomer; and
   R is a hydrogenated, partially fluorinated or fluorinated alkyl or cycloalkyl chain comprising 1 to 12 carbon atoms.

14. The substrate composition of claim 13, wherein the substrate is a semiconductor substrate.

15. The substrate of claim 13, wherein the substrate is a bulk single crystal silicon wafer.

16. The substrate of claim 13, wherein the substrate is a silicon or insulator wafer.

17. The topcoat composition according to claim 1, wherein $M_1$ represents at least one member selected from the group consisting of:

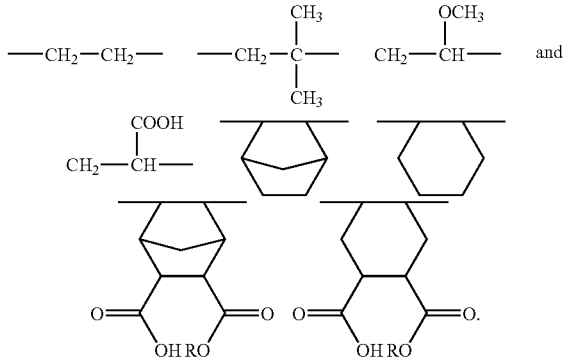

* * * * *